(12) United States Patent
Nomura et al.

(10) Patent No.: US 6,821,871 B2
(45) Date of Patent: Nov. 23, 2004

(54) METHOD FOR MANUFACTURING SEMICONDUCTOR DEVICE, SUBSTRATE TREATMENT METHOD, AND SEMICONDUCTOR MANUFACTURING APPARATUS

(75) Inventors: Hisashi Nomura, Tokyo (JP); Yushin Takasawa, Tokyo (JP); Hajime Karasawa, Tokyo (JP); Yoshinori Imai, Tokyo (JP); Tadanori Yoshida, Sayama (JP); Kenichi Yamaguchi, Tokyo (JP)

(73) Assignees: Hitachi Kokusai Electric Inc., Tokyo (JP); Hitachi, Ltd., Tokyo (JP)

( * ) Notice: Subject to any disclaimer, the term of this patent is extended or adjusted under 35 U.S.C. 154(b) by 0 days.

(21) Appl. No.: 09/879,122

(22) Filed: Jun. 13, 2001

(65) Prior Publication Data

US 2002/0016051 A1 Feb. 7, 2002

(30) Foreign Application Priority Data

Jun. 14, 2000 (JP) .......................... 2000-178735
May 29, 2001 (JP) .......................... 2001-160154

(51) Int. Cl.$^7$ .......................... H01L 21/22; H01L 21/38
(52) U.S. Cl. .................. 438/565; 438/479; 438/569
(58) Field of Search ................ 438/565, 569, 438/479

(56) References Cited

U.S. PATENT DOCUMENTS

| 4,028,151 A | * | 6/1977 | Lindmayer | 136/261 |
|---|---|---|---|---|
| 4,544,418 A | * | 10/1985 | Gibbons | 117/88 |
| 4,939,103 A | * | 7/1990 | Szolgyemy | 438/546 |
| 5,407,534 A | * | 4/1995 | Thakur | 438/398 |
| 5,514,620 A | * | 5/1996 | Aoki et al. | 438/565 |
| 5,639,685 A | * | 6/1997 | Zahurak et al. | 148/DIG. 138 |
| 5,696,014 A | * | 12/1997 | Figura | 438/398 |
| 5,882,991 A | * | 3/1999 | Paranjpe | 438/565 |
| 5,888,878 A | * | 3/1999 | Tsuchimoto et al. | 438/398 |
| 6,040,236 A | * | 3/2000 | Aiso | 438/482 |
| 6,218,260 B1 | * | 4/2001 | Lee et al. | 438/240 |
| 6,221,730 B1 | * | 4/2001 | Honma | 438/253 |
| 6,403,455 B1 | * | 6/2002 | el-Hamdi et al. | 438/398 |

FOREIGN PATENT DOCUMENTS

| JP | A-63-299363 | 12/1988 |
|---|---|---|
| JP | A-07-45529 | 2/1995 |
| JP | A-07-50264 | 2/1995 |
| JP | 2953396 | 7/1999 |
| JP | 2001-144025 | 5/2001 |

* cited by examiner

Primary Examiner—John F. Niebling
Assistant Examiner—Angel Roman
(74) Attorney, Agent, or Firm—Oliff & Berridge, PLC

(57) ABSTRACT

It is an object of the present invention to make it easy to diffuse phosphorus into a silicon film and allow the phosphorus diffusion concentration to be easily controlled by varying the timing at which the dopant gas is allowed to flow. A silicon wafer 10 on whose surface an amorphous silicon film 12 has been formed is placed in a diffusion furnace. After this, phosphine ($PH_3$) or a mixed gas containing phosphine is allowed to begin flowing over the wafer 15 and the phosphorus is diffused into the silicon film 12 before the amorphous silicon film 12 crystallizes and changes into a polysilicon film.

12 Claims, 4 Drawing Sheets

METHOD FOR MANUFACTURING SEMICONDUCTOR DEVICE, SUBSTRATE TREATMENT METHOD, AND SEMICONDUCTOR MANUFACTURING APPARATUS

BACKGROUND OF THE INVENTION

1. Field of the Invention

The present invention relates to a method for manufacturing a semiconductor device, a substrate treatment method, and a semiconductor manufacturing apparatus, and more particularly to an improved method for phosphorus diffusion, in which phosphorus is diffused into a silicon film, such as a polysilicon film or an amorphous silicon film, which is an under-layer formed on a substrate such as glass or a silicon wafer.

2. Description of the Related Art

The "diffusion step" in a semiconductor device manufacturing process is, for example, a step in which phosphorus, arsenic, boron, or another such impurity element is diffused in a silicon substrate. This phosphorus diffusion controls resistivity or sheet resistance by introducing phosphorus (P), which is an n-type impurity, through diffusion after the formation of a polysilicon film used as a resistor or wiring material or a gate electrode of a MOS transistor.

FIG. 4 is a simplified structural diagram of the diffusion apparatus used in the past to perform this phosphorus diffusion. The phosphine gas (or a mixed gas containing phosphine) that passes through a gas supply pipe 1 must be decomposed and activated. Methods that have been employed to decompose and activate this gas include heating in a gas preheating chamber 2 converting the gas into a plasma with a plasma generator 6, and utilizing the energy of heating a silicon wafer W in a reaction tube 5. The gas activated in the gas preheating chamber 2 or the plasma generator 6 is supplied from a gas introduction flange 3 to the reaction tube 5, which consists of a quartz tube or the like. The wafer W, on whose surface is formed a silicon film such as a polysilicon film or an amorphous silicon film, is inserted into the reaction tube 5 and heated by a heater 4. Phosphorus is diffused into the silicon film by allowing activated phosphine or a mixed gas containing phosphine to flow over this heated wafer W. The gas supplied to the reaction tube 5 is drawn out of an exhaust flange 7 by a vacuum pump 8 and exhausted through a gas exhaust pipe 9.

In a phosphorus diffusion process such as this, a wafer on which a silicon film such as a polysilicon film or an amorphous silicon film has been formed is heated, after which phosphine or a mixed gas containing phosphine is allowed to flow over this substrate so that the phosphorus is diffused into the silicon film. In the past this flow of gas was timed such that the phosphine or mixed gas containing phosphine flowed after the temperature of the wafer W had been raised to the diffusion process temperature.

Unfortunately, the following problems were encountered with conventional methods in which the gas flowed after the temperature of the substrate had been raised to the process temperature.

(1) When the underlying film is polysilicon, it is difficult to diffuse the phosphorus. If the underlying film is an amorphous silicon film, though, the amorphous silicon ends up migrating to the polysilicon by the substrate temperature raising, after which it tends to be more difficult to diffuse the phosphorus.

(2) During the substrate temperature raising, an in-plane temperature distribution in this substrate temperature raising process results in uneven polysilicon conversion within the substrate plane, so the concentration in which the phosphorus is diffused within the substrate plane cannot be kept uniform.

The inventors discovered that the way phosphorus enters an amorphous silicon film is different from that with a polysilicon film, and that phosphorus has considerable difficulty entering a polysilicon film, and arrived at the present invention on the basis of the knowledge that the phosphorus should be diffused into an amorphous silicon film that has yet to make the transition to a polysilicon film, or while the film is in a mixed crystal state consisting of both amorphous and polycrystalline forms, as a result thereof, the condition is obtained in which the phosphorus can be easily doped by enhancing the rate-determining factor of polysilicon conversion utilizing respective properties of the elements, phosphorus of Group 5 and silicon of Group 4.

SUMMARY OF THE INVENTION

It is an object of the present invention to solve the above problems encountered with prior art and provide semiconductor device manufacturing method and a semiconductor manufacturing apparatus with which phosphorus diffusion is easy and the diffused phosphorus concentration can be easily controlled, which is accomplished by varying the timing at which the dopant gas is allowed to start flowing.

The first invention is a method for manufacturing a semiconductor device, comprising raising to a process temperature a temperature of a substrate on whose surface a silicon film has been formed and diffusing phosphorus in the silicon film, wherein the diffusing step includes a diffusing step which diffuses the phosphorus in the silicon film by exposing the substrate to phosphine or a mixed gas containing phosphine in the process in which the temperature of the substrate is raised to the process temperature.

The above-mentioned substrate is glass, a silicon wafer, or the like. The process temperature is the temperature required to introduce phosphorus (an impurity, or dopant) through diffusion into a certain region of a silicon film at the desired diffusion depth and concentration distribution. The gas that flows over the substrate may be phosphine gas alone or a mixed gas containing phosphine. The semiconductor device is a NOS transistor, a bipolar transistor, or the like.

With the first invention, in the substrate temperature raising process in which the temperature of the substrate is raised to the process temperature, the substrate is exposed to phosphine or a mixed gas containing phosphine before the temperature of the substrate actually is raised to the process temperature, so it is easier for the phosphorus to enter the silicon film than when the substrate is exposed to the gas after the temperature of the substrate being raised to the process temperature, which means that the diffusion of phosphorus into the silicon film is promoted and uniformity of the phosphorus concentration is enhanced.

With the first invention, while exposing the substrate to phosphine or a mixed gas containing phosphine, the phosphine or mixed gas containing phosphine can be allowed to flow over the substrate.

Alternatively, with the first invention, phosphine or a mixed gas containing phosphine may be introduced in the reaction chamber in which the substrate has been inserted, while exposing the substrate to the phosphine or mixed gas containing phosphine in this case, throughput is improved because the gas introduction step and substrate heating step are carried out in parallel.

Alternatively, with the first invention, while exposing the substrate to phosphine or a mixed gas containing phosphine, the phosphine or mixed gas containing phosphine can be allowed to be introduced into the reaction chamber and sealed therein after the substrate has been inserted in the reaction chamber but before the temperature of the substrate is raised, and the flow of the phosphine or mixed gas containing phosphine can be allowed to be halted during the raising of the temperature of the substrate. In this case, throughput is not as good since the gas introduction step and substrate heating step are carried out separately, but the same effect is obtained as when the gas introduction step and substrate heating step are carried out in parallel.

With the first invention, the mixed gas containing phosphine can be a mixed gas containing phosphine and nitrogen, a mixed gas containing phosphine and hydrogen, or a mixed gas containing phosphine and helium.

With the first invention, the process temperature is preferably 450 to 800° C. Doping will become the rate-determining factor if the polysilicon conversion temperature (over about 600° C.) is reached during the phosphorus diffusion, so a low-temperature process of about 450° C. is best. When out-diffusion during exhaust after the substrate treatment is taken into account, the upper limit temperature is 800° C.

With the first invention, the temperature raising time is preferably 1 to 3 minutes in the substrate temperature raising process in which the temperature of the substrata is raised to the process temperature. This is because the time must be as short as possible in order shorten the time a WELL diffusion layer in the transistor under a capacitor is heated.

With the first invention, the silicon film may also be in an amorphous state or in a mixed crystal state consisting of both amorphous and polycrystalline forms. HSG (Hemi-Spherical Grained Silicon) is an example of a mixed crystal state consisting of both amorphous and polycrystalline forms.

With the first invention, it is preferable if the substrate continues to be exposed to the phosphine or mixed gas containing phosphine even after the temperature of the substrate has reached the process temperature. If the substrate continues to be exposed to the phosphine or mixed gas containing phosphine even after the temperature of the substrate has reached the process temperature, then diffusion of the phosphorus into the silicon film will be further promoted and the phosphorus concentration and the uniformity of the phosphorus concentration will be even better.

The second invention is a method for manufacturing a semiconductor device, comprising raising to a process temperature a temperature of a substrate on whose surface a silicon film has been formed and diffusing phosphorus in the silicon film, wherein the diffusing step includes a diffusing step which diffuses the phosphorus in the silicon film by exposing the substrate to phosphine or a mixed gas containing phosphine before the silicon film crystallizes.

With the second invention, the substrate is exposed to phosphine or a mixed gas containing phosphine before the silicon film crystallizes. Accordingly, the phosphorus can be diffused while the film is still a silicon film that has not yet completely crystallized. As a result, the phosphorus concentration and the uniformity of the phosphorus concentration can be improved in a phosphorus-doped silicon film. Also, since the gas flows before any deviation occurs in crystallization, the phosphorus diffusion concentration within the substrate plane can be uniformly controlled.

Alternatively, with the second invention, while exposing the substrate to phosphine or a mixed gas containing phosphine, the phosphine or mixed gas containing phosphine can be made to flow over the substrate.

Alternatively, with the second invention, the silicon film may also be in an amorphous state or in a mixed crystal state consisting of both amorphous and polycrystalline forms.

Alternatively, with the second invention, while exposing the substrate to phosphine or a mixed gas containing phosphine, the phosphine or mixed gas containing phosphine can be allowed to be introduced into the reaction chamber and sealed therein after the substrate has been inserted in the reaction chamber but before the temperature of the substrate is raised, and the flow of the phosphine or mixed gas containing phosphine can be allowed to be halted during the raising of the temperature of the substrate.

The third invention is a substrate treatment method, comprising raising to a process temperature a temperature of a substrate on whose surface a silicon film has been formed and diffusing phosphorus in the silicon film, wherein the diffusing step includes a diffusing step which diffuses the phosphorus in the silicon film by exposing the substrate to phosphine or a mixed gas containing phosphine in the process in which the temperature of the substrate is raised to the process temperature.

With the third invention, in the substrate temperature raising process in which the temperature of the substrate is raised, the substrate is exposed to phosphine or a mixed gas containing phosphine before the temperature of the substrate actually is raised to the process temperature, so it is easier for the phosphorus to enter the silicon film than when the substrate is exposed to the gas after the temperature of the substrate being raised to the process temperature, which means that the diffusion of phosphorus into the silicon film is promoted and the phosphorus concentration and uniformity of the phosphorus concentration is enhanced.

With the third invention, while exposing the substrate to phosphine or a mixed gas containing phosphine, the phosphine or mixed gas containing phosphine can be also made to flow over the substrate.

Alternatively, with the third invention, while exposing the substrate to phosphine or a mixed gas containing phosphine, the phosphine or mixed gas containing phosphine can be also allowed to be introduced into the reaction chamber and sealed therein after the substrate has been inserted in the reaction chamber but before the temperature of the substrate is raised, and the flow of the phosphine or mixed gas containing phosphine can be allowed to be halted during the temperature raising of the substrate.

The fourth invention is a semiconductor manufacturing apparatus, comprising a reaction tube, a gas introduction mechanism that introduces phosphine or a mixed gas containing phosphine into the reaction tube, a gas exhaust mechanism that exhausts the gas introduced into the reaction tube, a heater that raises a temperature of a substrate on whose surface a silicon film has been formed to a process temperature inside the reaction tube, and a controller that introduces the phosphine or a mixed gas containing phosphine into the reaction tube by controlling the gas introduction mechanism in the process in which the temperature of the substrate is being raised to the process temperature.

Thus, phosphorus can be diffused before the temperature of the substrate is raised to the process temperature, which is accomplished by a simple structure in which the flow of the phosphine or the mixed gas containing phosphine is controlled by the controller to start in the substrate heating process before the temperature of the substrate reaches to the process temperature, rather than after the temperature of the substrate has already reached to the process temperature, so the phosphorus concentration can be increased, and the diffusion is controlled so that the substrate in-plane phosphorus concentration is kept uniform.

With the fourth invention, the silicon film may also be in an amorphous state or in a mixed crystal state consisting of both amorphous and polycrystalline forms.

DESCRIPTION OF THE PREFERRED EMBODIMENTS

Figure 1:
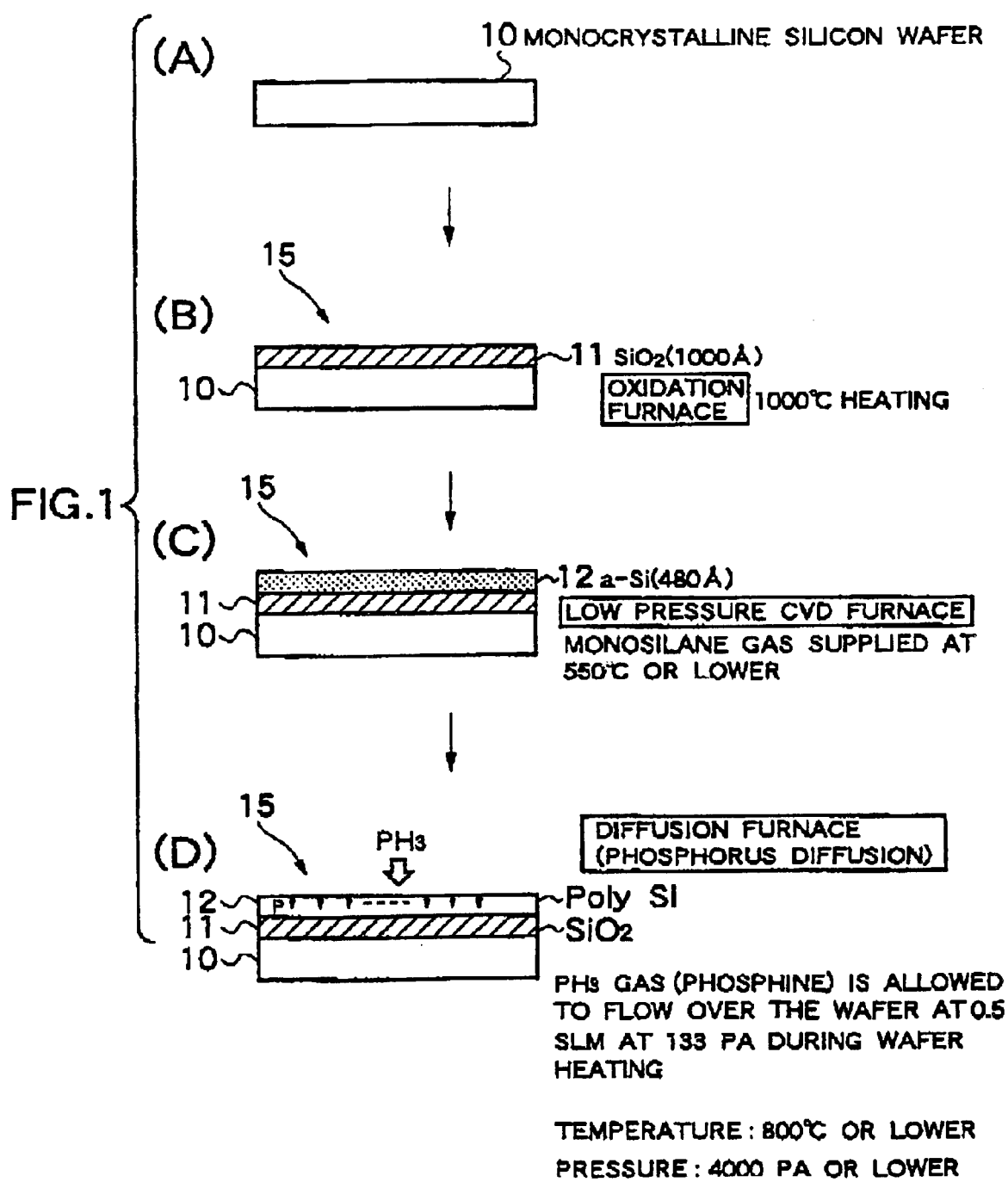
FIG. 1 is a step diagram illustrating an embodiment of the phosphorus diffusion method.

The phosphorus diffusion process for implementing the semiconductor device manufacturing method or the substrate treatment method pertaining to the present invention will now be described through reference to FIG. 1. A monocrystalline silicon wafer is used for the substrate. First, the monocrystalline silicon wafer 10 shown in FIG. 1(A) is placed in an oxidation furnace (not shown) and heated to 1000° C. to form an $SiO_2$ film 11 in a thickness of 1000 angstroms on the silicon wafer 10 (FIG. 1(B)).

Next, the wafer 15 on which this $SiO_2$ film 11 has been formed is taken out of the oxidation furnace and placed in a low pressure CVD furnace (not shown). Monosilane gas is supplied to this low pressure CVD furnace at 550° C. or lower to form an amorphous silicon film 12 in a thickness of 480 angstroms over this $SiO_2$ film 11 (FIG. 1(C)). The reaction formula here is as follows, in which a-si refers to amorphous silicon.

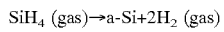

$SiH_4$ (gas)→a-Si+$2H_2$ (gas)

The wafer 15 on which the above-mentioned amorphous silicon film 12 has been formed is then placed in a diffusion furnace, where phosphorus diffusion is performed on the amorphous silicon film 12. Specifically, the wafer is transported into and heated in a reaction chamber inside a reaction tube heated in a low pressure state of about 133 Pa. The diffusion conditions comprise a process temperature of 800° C. or lower and a pressure within the furnace of 4000 Pa or less. The dopant gas is, for example, a mixed gas consisting of $N_2$ gas containing 1% phosphine ($PH_3$). This mixed gas is supplied to the reaction chamber at no more than a flux of 0.5 slm. The supply of this mixed gas is commenced along with the raising the temperature of the wafer, rather than waiting for the water to reach the specified process temperature of 800° C. or lower. Phosphorus is diffused in the amorphous silicon film 12 being the underlying film by allowing the mixed gas to flow over the wafer 15 for the specified time (FIG. 1(D)). A mixed gas containing $PH_3$ gas in $H_2$ gas, or a mixed gas containing $PH_3$ gas in helium gas may be used instead of the above-mentioned mixed gas.

The reaction formula here is as follows.

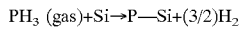

$PH_3$ (gas)+Si→P—Si+$(3/2)H_2$

P—Si here stands for polysilicon doped with phosphorus. The $(3/2)H_2$ is exhausted from the diffusion furnace.

Figure 2:
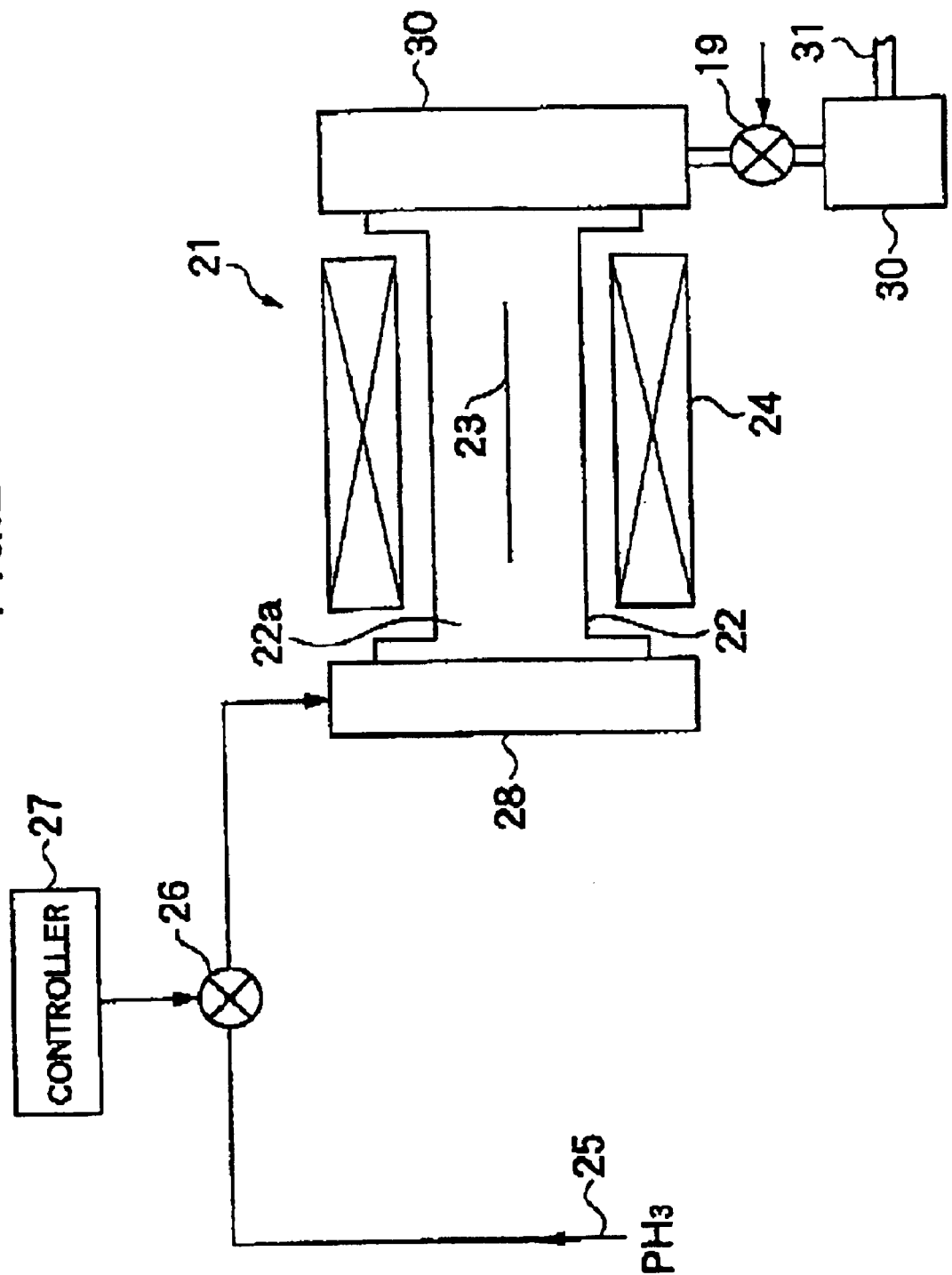
FIG. 2 is a simplified structural diagram of the diffusion apparatus in an embodiment.

FIG. 2 is a simplified structural diagram of the diffusion apparatus including the diffusion furnace 21 used in the above embodiment.

The diffusion furnace 21 is a hot-wall type of single-wafer processing apparatus, and mainly comprises a reaction tube 22 having a reaction chamber 22a formed in its interior, a gas introduction flange 28 provided at the inlet to the reaction tube 22, an exhaust flange 29 provided at the outlet of the reaction tube 22, and a heater 24 that serves as the heating mechanism. The reaction tube 22 is consisted of a quartz tube or the like. A wafer 23, on whose surface is formed a silicon film such as an amorphous silicon film, is placed in the reaction chamber 22a. One or more of these wafers 23 are inserted and laid flat therein.

The temperature of the wafer 23 in the reaction chamber 22a is raised to the specified process temperature by the heater 24 provided around the outside of the reaction tube 22. This heater 24 can be a resistance heater, for instance.

Either phosphine ($PH_2$) gas alone or a mixed gas containing phosphine, such as a mixed gas of $PH_3$ and $N_2$, is introduced into this diffusion furnace 21 through a gas supply pipe 25. The phosphorus or mixed gas containing phosphine passing through the gas supply pipe 25 is supplied at a specific timing from the gas introduction flange 28 to the reaction chamber 22a, decomposed, and activated. The gas supplied to the reaction chamber 22a is pumped out of the exhaust flange 29 through a gas exhaust pipe 31 by a vacuum pump 30.

A control valve 26 is provided at some point along the above-mentioned gas supply pipe 25. The timing at which the mixed gas is supplied to the reaction chamber 22a is determined by controlling the control valve 26 with a controller 27. The pressure in the reaction chamber 22a is controlled by opening and closing an automatic pressure control valve (not shown) provided to the gas exhaust pipe 31 according to the pressure in the reaction chamber 22a. This control is effected by the above-mentioned controller 27.

The gas introduction mechanism of the present invention comprises the above-mentioned gas supply pipe 25. The gas exhaust mechanism comprises the above-mentioned 30 and gas exhaust pipe 31. The control mechanism comprises the above-mentioned controller 27 and control valve 26.

A method for diffusing phosphorus into a silicon film using this diffusion apparatus will now be described.

A wafer 23, on whose surface is formed a silicon film such as an amorphous silicon film, is placed in the reaction chamber 22a. Along with the wafer insertion, the raising temperature of the wafer 23 by the heater 24 is begun, and the temperature of the wafer is raised to the process temperature over a specific length of time After the wafer insertion, the reaction chamber 22a is purged for a specific length of time with $N_2$ gas. After $N_2$ purging, the control valve 26 is opened by the controller 27, and the phosphine or mixed gas containing phosphine such as the mixed gas containing $PH_3$ and $N_2$ is continuously supplied to the diffusion furnace 21 both during and after the wafer temperature raising. The supplied gas flows from the gas introduction flange 28 into the reaction chamber 22a, and gas is exhausted from the exhaust flange 29 so that the pressure inside the reaction chamber 22a will be kept at the specified pressure. The silicon film is exposed to $PH_3$ both during and after wafer temperature raising, which diffuses vapor phase phosphorus into the silicon film on the wafer 23. After the mixed gas has flowed for the specified time, the supply of mixed gas is halted and phosphorus diffusion concluded. After any residual gas has been exhausted, the wafer 23 is taken out of the reaction chamber 22a.

The following are the preferred treatment conditions (process recipe) for phosphorus diffusion.

(a) Process Temperature

The silicon film being doped is amorphous silicon, and if it is heated to over the temperature at which it becomes polysilicon (about 600° C.), doping will become the rate-determining factor through the relationship of the atomic bonds, so the process temperature should be low. Controlling the heating of the underlying diffusion layer (silicon film) will also be easier with a low-temperature process. Meanwhile, phosphorus diffusion can be broadly broken down into three recipe events: temperature raising (pre-doping), main doping, and exhaust, but out-diffusion will occur if 800° C. is exceeded during exhaust, resulting in a higher proportion of phosphorus going into the silicon film. Therefore, since there is an overall need for a lower temperature, the process temperature should be between 450 and 800° C. The above-mentioned pre-doping refers to phosphorus doping in the course of the temperature raising of the substrate, while main doping refers to phosphorus doping after the temperature of the substrate has been raised to the process temperature.

(b) Pressure

For the sake of shortening the event time of exhaust in the above-mentioned recipe events, and achieved the required amount of doping (phosphorus concentration), the pressure should be between several hundreds of Pa and several tens of thousands of Pa.

(c) Gas Type

The mixed gas is composed of a raw material gas containing a dopant, and a carrier gas that carries this raw material gas. A gas containing phosphorus (P) such as phosphine ($PH_3$) is preferable as the raw material gas. Hydrogen ($H_2$), an inert gas ($N_2$, He), or the like is good as the carrier gas. In more specific terms, a 1% $PH_3/N_2$ base, 1% $PH_3/H_2$ base, or 1% $PH_3$/He base is good. "1% $PH_3/N_2$ base" as used here means that a base $N_2$ gas contains 1% phosphine $PH_3$. $N_2$, which is the same as the purging gas, is generally used for the carrier gas.

(d) Gas Flux

This will vary with the doping concentration and the treatment pressure, but since a lower flux is needed in order to keep running costs low, the gas flux is preferably 0.01 to 0.5 slm.

(e) Temperature Raising Time

Since this time must be as short as possible in terms of controlling the underlying diffusion layer region, the temperature raising time is preferably 1 to 3 minutes. For example, when the time is 2 minutes, the $N_2$ gas purging time will be 0.5 minutes and the $PH_3$ supply time will be 1.5 minutes.

(f) Time Between Wafer Insertion and Removal

This is a parameter that needs to be shortened, and when throughput is taken into account, the time between wafer insertion and removal is preferably 3.0 to 10.0 minutes. For example, when the time is 6.0 minutes, the temperature raising time (including pre-doping) will be 3.0 minutes, the main doping time will be 2.0 minutes, and the exhaust time will be 1.0 minute.

(g) Time Between Wafer Insertion and $PH_3$ Introduction

This is the time up to the start of pre-doping. Due to gas interlock considerations, it is difficult to let the $PH_3$ flow immediately after the start of the recipe, and a certain interval must be left, so the time from wafer insertion up to the introduction of $PH_3$ is preferably 5.0 seconds to 0.5 minute.

(h) $PH_3$ Supply Time

This will vary with the doping amount (phosphorus concentration), but since the objective is to shorten the time and to improve the throughput, it is preferable for the supply of $PH_3$ to take from 1.0 to 7.0 minutes. This time indicates the sum of the pre-doping time and the main doping time.

(i) Exhaust (Residual Gas Removal) Time

This time must be shortened in order to control out-diffusion, and if we include the $N_2$ replacement time and the above-mentioned out-diffusion, the exhaust (residual gas removal) time is preferably 0.5 to 2.0 minutes.

The effect that the timing from wafer insertion up to the start of the $PH_3$ flow has on the phosphorus concentration here was examined. FIG. 3 is an evaluative process recipe, where (A) is a comparative example, (B) and (C) are working examples, and in which the timing from wafer insertion up to the start of the $PH_3$ flow is varied. The conditions are the same in every case; the temperature inside the furnace is 700 to 800° C., the pressure in the furnace is 2000 to 4000 Pa, the dopant gas is a mixed gas of $N_2$ gas containing 1% phosphine ($PH_3$), and the mixed gas flux is at any value no more than 0.5 slm. The time it took from wafer insertion until the temperature of the wafer was raised to the process temperature was $T_2$ minute, and this is the same in all the examples and is the heating time shown in FIG. 3D. In the comparative example (a) and a working example (b), but not in example (c), the time from wafer insertion to wafer removal was $T_4$ minute, with the total treatment time being the same.

Figure 3A:
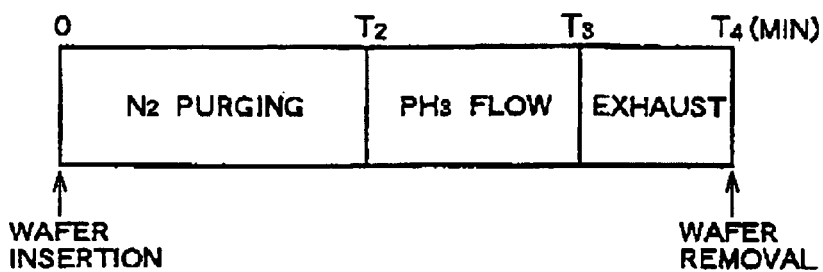
FIGS. 3A–3D are comparative diagrams of the phosphorus diffusion process recipe in a comparative example and an example of the present invention.

With the process recipe of the comparative example shown in FIG. 3A. $N_2$ purging is performed at 0 to $T_2$ minute, the $PH_3$ flow is started at $T_2$ minute and concluded at $T_3$ minute, and exhaust is performed at $T_3$ to $T_4$ minute. In this comparative example the $PH_3$ flow begins after the water temperature has reached the process temperature. The uniformity of phosphorus concentration within the wafer plane here was ±4.8%, and the phosphorus concentration was $3.8 \times 10^{20}$ atoms/cm$^2$.

Figure 3B:
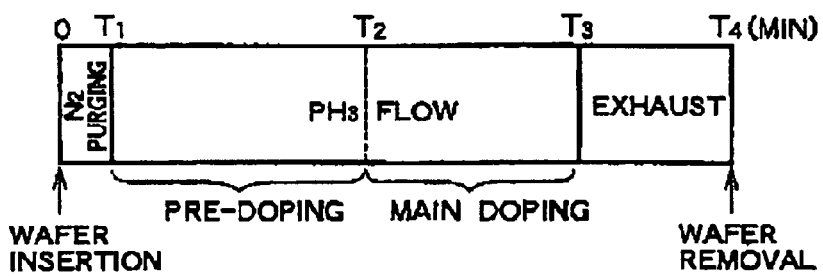

With the process recipe of the working example shown in FIG. 3B, $N_2$ purging is performed at 0.0 to $T_1$ minute, the $PH_3$ flow is started at $T_1$ minute and concluded at $T_3$ minute, just as in the comparative example. With this $PH_3$ flow, pre-doping is performed until the $T_2$ minute it takes for the inside of the furnace to reach the process temperature, while main doping is performed from the $T_2$ minute point at which the inside of the furnace reaches the process temperature. The $PH_3$ flow is halted and exhaust is performed at $T_3$ to $T_4$ minute. In this example, the $PH_3$ flow starts before the temperature of the wafer reaches the process temperature. The uniformity of phosphorus concentration within the wafer plane here was ±3.1%, and the phosphorus concentration was $4.2 \times 10^{20}$ atoms/cm$^2$. The phosphorus concentration uniformity reaches less than ±3% under these conditions.

Figure 3C:
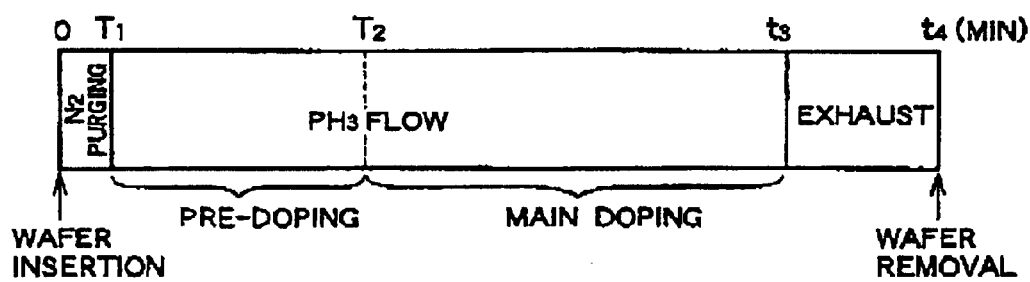
Figure 3D:
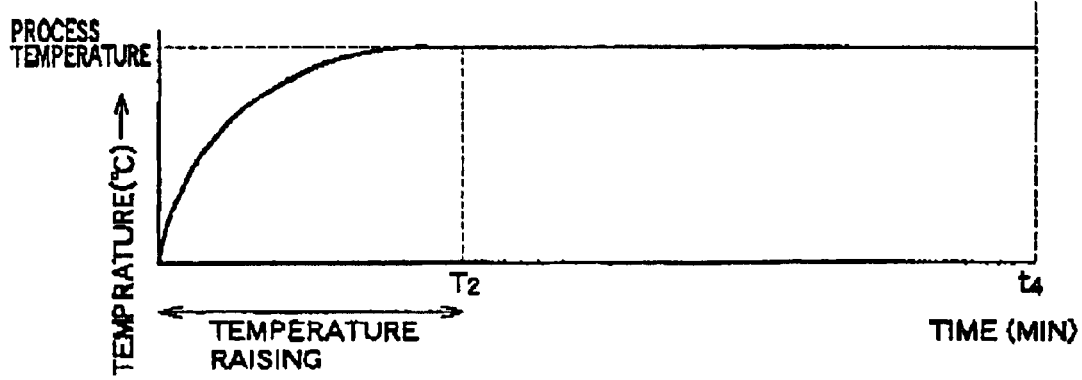
Figure 4:
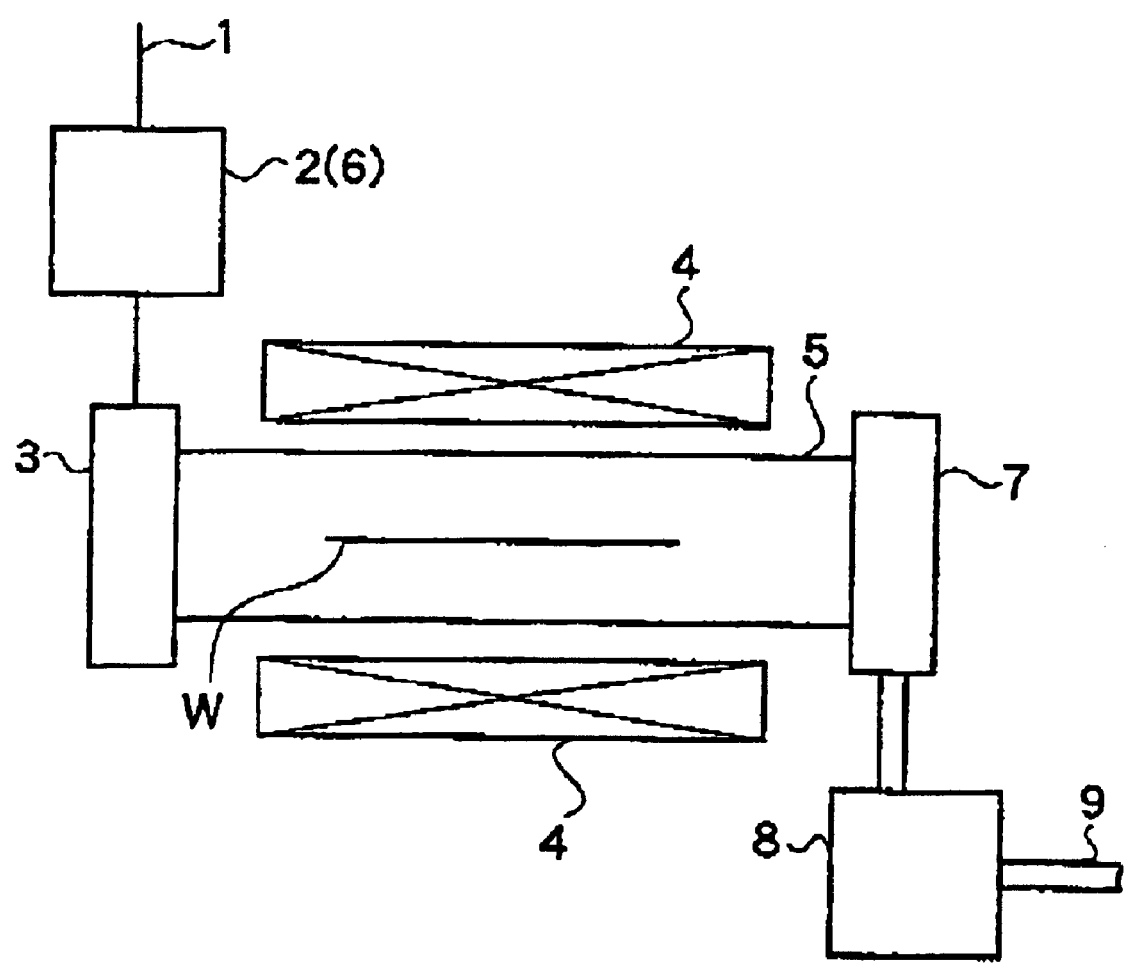
FIG. 4 is a simplified structural diagram of a conventional diffusion apparatus.

With the process recipe of the working example shown in FIG. 3C, $N_2$ purging is performed at 0 to $T_1$ minute, the $PH_3$ flow is started at $T_1$ minute and continued until $t_3$ minute, making it longer than in the comparative example of FIG. 3A and in the working example of FIG. 3B. Therefore, pre-doping is performed at $T_1$ to $T_2$ minute, while main doping is performed $T_2$ to $t_3$ minute. The $PH_3$ flow is halted and exhaust is performed at $t_3$ to $t_4$ minute with the time between wafer insertion removal being $t_4$ minute ($T_4 < t_3$). In this example, the $PH_3$ flow is continued for a relatively long time even after the temperature of the wafer reaches the process temperature in order to better promote the diffusion of phosphorus into the silicon film and further increase the uniformity of phosphorus concentration. The uniformity of phosphorus concentration within the wafer plane here was about ±1.5%, and the phosphorus concentration was $5.0 \times 10^{20}$ atoms/cm$^2$.

These evaluation results reveal that if the start timing from wafer insertion to PH$_3$ flow is set to be before T$_2$ minute, that is, before the temperature of the wafer reaches the process temperature, then the silicon film can be exposed to PH$_3$ while being heated, and the phosphorus is doped in silicon film so that the rate-determining factor of polysilicon conversion of the silicon film can be enhanced with the temperature being raised, and the phosphorus can be diffused before the silicon film has yet to make a complete transition to a polysilicon film, so there is a good phosphorus concentration within the wafer plane.

As discussed above, the timing of gas supply to the reaction chamber 22a should be controlled by the controller 27 and the control valve 26 such that the mixed gas will flow after the wafer insertion but before a wafer in-plane temperature deviation has occurred, that is, before there is a complete conversion to a polycrystalline state. If the start timing of the mixed gas flow is thus controlled, then even if a deviation should occur due to a non-uniform in-plane wafer temperature in the temperature raising process, the phosphorus concentration distribution will be an in-plane distribution that includes no hysteresis from the temperature raising process. It is therefore easier to keep the concentration distribution uniform and to control the film quality provided by the crystallinity of the underlying layer (the change from amorphous silicon to polysilicon).

The above-mentioned embodiments were for a case in which the underlying layer was amorphous silicon, but the present invention is not limited to this. The silicon film may be in a mixed crystal state consisting of both amorphous and polycrystalline forms. For instance, the present invention can also be applied when the underlying layer is HSG. HSG consists of jagged hemispherical crystal grains formed on the surface of an amorphous silicon film. This HSG is believed to be in the midst of a transition from amorphous to polycrystalline, and in a mixed crystal state consisting of both amorphous and polycrystalline forms. Therefore, even if the underlying layer is HSG, if the diffusion of phosphorus is begun before there is a complete conversion to a polycrystalline form, then the diffusion of phosphorus into the silicon film will be promoted and the phosphorus concentration will be more uniform.

With the present invention, in the course of diffusing phosphorus into a substrate on which a silicon film has been formed, the phosphorus can be diffused into the substrate on which has been formed a silicon film that has yet to change into a polysilicon film if the substrate is exposed to phosphine or a mixed gas containing phosphine while the temperature of the substrate is being raised. Accordingly, phosphorus diffusion is easier, the phosphorus diffusion concentration can be kept uniform within the wafer plane, and the uniformity of phosphorus concentration in a phosphorus-doped polysilicon film can be improved.

What is claimed is:

1. A method for manufacturing a semiconductor device, comprising the steps of:
    transferring a substrate into a reaction chamber on whose surface a silicon film in a mixed crystal state consisting of both amorphous and polycrystalline forms has been formed;
    raising a temperature of the substrate to a process temperature from a room temperature; and
    diffusing phosphorus in the silicon film,
    wherein the diffusing step includes a diffusing step that diffuses the phosphorus in the silicon film to obtain the uniformity of the phosphorus concentration in the surface of the substrate to be less than ±3%, by exposing the substrate to phosphine or a mixed gas containing phosphine by supplying phosphine or the mixed gas containing phosphine to a reaction chamber through a gas supply pipe at some midpoint in the step in which the temperature of the substrate is raised to the process temperature from the room temperature.

2. The method for manufacturing a semiconductor device according to claim 1, wherein the silicon film is a silicon film containing HSG.

3. The method for manufacturing a semiconductor device according to claim 1, wherein the mixed gas is a mixed gas containing phosphine and nitrogen, a mixed gas containing phosphine and hydrogen, or a mixed gas containing phosphine and helium.

4. The method for manufacturing a semiconductor device according to claim 1, wherein the process, temperature is 450 to 800° C.

5. The method for manufacturing a semiconductor device according to claim 1, wherein the silicon film is a nondoped film.

6. The method for manufacturing a semiconductor device according to claim 1, wherein the substrate continues to be exposed to the phosphine or mixed gas containing phosphine even after the temperature of the substrate has reached the process temperature.

7. A substrate treatment method, comprising the steps of:
    transferring a substrate into a reaction chamber on whose surface a silicon film in a mixed crystal state consisting of both amorphous and polycrystalline forms has been formed;
    raising a temperature of a substrate to a process temperature from a room temperature; and
    diffusing phosphorus in the silicon film,
    wherein the diffusing step includes a diffusing step that diffuses the phosphorus in the silicon film to obtain the uniformity of the phosphorus concentration in the surface of the substrate to be less than ±3%, by exposing the substrate to phosphine or a mixed gas containing phosphine by supplying phosphine or the mixed gas containing phosphine to a reaction chamber through a gas supply pipe at some midpoint in the step in which the temperature of the substrate is raised to the process temperature from the room temperature.

8. The substrate treatment method according to claim 7, wherein the silicon film is a silicon film containing HSG.

9. The substrate treatment method according to claim 7, wherein the silicon film is a nondoped film.

10. A method for manufacturing a semiconductor device, comprising the steps of:
    transferring a substrate into a reaction chamber on whose surface a silicon film has been formed;
    raising a temperature of the substrate to a process temperature from a room temperature; and
    diffusing phosphorus in the silicon film,
    wherein the diffusing step includes a diffusing step that diffuses the phosphorus in the silicon film to obtain the uniformity of the phosphorus concentration in the surface of the substrate to be less than ±3% by exposing the substrate to phosphine or a mixed gas containing phosphine by supplying phosphine or the mixed gas containing phosphine to a reaction chamber through a gas supply pipe before a deviation occurs in the temperature in the surface of the substrate in the step in which the temperature of the substrate is raised to the process temperature from the room temperature and wherein the silicon film is a silicon film in a mixed crystal state consisting of both amorphous and polycrystalline forms.

11. The method for manufacturing a semiconductor device according to claim 10, wherein the silicon film is a silicon film containing HSG.

12. The method for manufacturing a semiconductor device according to claim 10, wherein the silicon film is a nondoped film.

* * * * *